United States Patent
Sakata et al.

(10) Patent No.: US 8,277,686 B2
(45) Date of Patent: Oct. 2, 2012

(54) SIALON PHOSPHOR PARTICLES AND PRODUCTION METHOD THEREOF

(75) Inventors: Shin-ichi Sakata, Ube (JP); Takeshi Yamao, Ube (JP); Tetsuo Yamada, Ube (JP)

(73) Assignee: Ube Industries, Ltd. (JP)

( * ) Notice: Subject to any disclaimer, the term of this patent is extended or adjusted under 35 U.S.C. 154(b) by 1178 days.

(21) Appl. No.: 11/793,965

(22) PCT Filed: Dec. 22, 2005

(86) PCT No.: PCT/JP2005/024177
§ 371 (c)(1),
(2), (4) Date: May 12, 2008

(87) PCT Pub. No.: WO2006/070899
PCT Pub. Date: Jul. 6, 2006

(65) Prior Publication Data
US 2008/0309220 A1    Dec. 18, 2008

(30) Foreign Application Priority Data
Dec. 27, 2004 (JP) ................................ 2004-375580

(51) Int. Cl.
*C09K 11/08* (2006.01)
*C09K 11/66* (2006.01)
*H01J 1/62* (2006.01)

(52) U.S. Cl. ................ 252/301.4 F; 313/503
(58) Field of Classification Search .......... 252/301.4 F, 252/301.4 R; 313/467, 468, 503, 504
See application file for complete search history.

(56) References Cited

U.S. PATENT DOCUMENTS

| | | | | | |
|---|---|---|---|---|---|
| 5,585,084 | A | * | 12/1996 | Yamada et al. | 423/344 |
| 2004/0155225 | A1 | * | 8/2004 | Yamada et al. | 252/301.4 R |
| 2004/0229447 | A1 | * | 11/2004 | Swihart et al. | 438/507 |
| 2005/0001225 | A1 | * | 1/2005 | Yoshimura et al. | 257/98 |
| 2006/0208260 | A1 | * | 9/2006 | Sakuma et al. | 257/76 |
| 2009/0284948 | A1 | * | 11/2009 | Yamao et al. | 362/84 |
| 2011/0133629 | A1 | * | 6/2011 | Sakata et al. | 313/483 |

FOREIGN PATENT DOCUMENTS

| | | | |
|---|---|---|---|
| JP | 2000-208815 A | | 7/2000 |
| JP | 2002-363554 A | | 12/2002 |
| JP | 2002363554 A | * | 12/2002 |
| JP | 2003-292950 A | | 10/2003 |
| JP | 2004-067837 A | | 3/2004 |
| JP | 2004-285233 A | | 10/2004 |
| JP | 2004-307869 A | | 11/2004 |
| JP | 2005-255885 A | | 9/2005 |

OTHER PUBLICATIONS

John F. Moulder et al., "Handbook of X-ray Photoelectron Spectroscopy," Physical Electronics, Inc., USA, pp. 150-151, 220-221.

* cited by examiner

*Primary Examiner* — Emily Le
*Assistant Examiner* — Lynne Edmondson
(74) *Attorney, Agent, or Firm* — DLA Piper LLP (US)

(57) ABSTRACT

To provide sialon phosphor particles or a powder exhibiting high emission intensity in the region from ultraviolet to blue and not requiring a strong pulverization operation for pulverizing a sintered body or a large aggregated lump, and a production method thereof. Sialon phosphor particles represented by the formula: $M_xLn_ySi_{12-(m+n)}Al_{(m+n)}O_nN_{16-n}$ (wherein M is at least one metal selected from the group consisting of Li, Ca, Mg and Y, Ln is a lanthanide metal containing at least Eu, and assuming that the valence of the metal M is a and the valence of the lanthanide metal Ln is b, ax+by=m, x is $0<x$, $y \leq 2.0$, $0.3 \leq m < 4.5$ and $0.5 \leq n < 2.5$), wherein in the surface analysis by X-ray photoelectron spectroscopy, the ratio between the peak area of $3d_{5/2}$ spectrum of europium and the peak area of 2p spectrum of Si is 0.5 or less.

20 Claims, 7 Drawing Sheets

SIALON PHOSPHOR PARTICLES AND PRODUCTION METHOD THEREOF

CROSS-REFERENCE TO RELATED APPLICATIONS

This application is a §371 of International Application No. PCT/JP2005/024177, with an international filing date of Dec. 22, 2005 (WO 2006/070899 A1, Jul. 6, 2006), which is based upon and claims the benefit of priority from Japanese Patent Application No. 2004-375580, filed on Dec. 27, 2004, the entire contents of which are incorporated herein by reference.

TECHNICAL FIELD

This disclosure relates to europium-activated sialon phosphor particles, a sialon phosphor powder and the production method thereof.

BACKGROUND

With recent practical implementation of a blue light-emitting diode, studies are being aggressively made to develop a white light-emitting diode using the blue diode as the light emission source. The white light-emitting diode is lightweight, uses no mercury and has a long life, and therefore demands are expected to rapidly expand in the future. As for the method of converting the blue light of the blue light-emitting diode into white light, a method described, for example, in Japanese Unexamined Patent Publication (Kokai) No. 2000-208815 is most commonly performed, in which a coating layer containing a fluorescent material capable of absorbing part of blue light and emitting yellow light in the complementary-color relationship with blue light is provided. A mold layer for mixing the blue light of the light source and the yellow light from the coating layer is also provided in front of a light-emitting element which emits blue light. The coating layer heretofore employed is formed by coating a mixture of cerium-activated YAG ($Y_3Al_5O_{12}$:Ce) powder and an epoxy resin on a light-emitting element. However, when a white LED is produced using a Ce-doped YAG, the light emitted contains a slightly blue-green tint and good white light cannot be obtained, because the fluorescent color of YAG:Ce is not completely complementary to blue.

On the other hand, a sialon-based phosphor activated by a rare earth element emits fluorescence of which the wavelength is longer than the fluorescence of Ce-doped YAG and is shifted to the red side, and therefore, when a sialon-based phosphor is used, a good white light-emitting diode can be produced using the blue light-emitting diode. The sialon-based phosphor itself is disclosed in Japanese Unexamined Patent Publication (Kokai) No. 2002-363554, but the sialon phosphor disclosed therein is a sintered body produced by a hot-press method. The method disclosed in Japanese Unexamined Patent Publication (Kokai) No. 2000-208815 is widely employed as a production method of a white light-emitting diode, but in this technique, a phosphor powder is necessary. Therefore, in the case of a sialon phosphor produced by hot-pressing as in Japanese Unexamined Patent Publication (Kokai) No. 2002-363554, the phosphor needs to be strongly pulverized and formed into powder particles.

Consequently, we attempted a synthesis to obtain a powder sialon and found that a raw material composition containing a large amount of oxygen must be formulated to obtain a sialon phosphor powder. When a sialon is produced using a raw material composition containing a large amount of oxygen, the production of powder is relatively easy, but there is a problem in that the intensity of emission decreases.

We also confirmed that the obtained powder forms a large aggregated lump resulting from aggregation of sialon particles through a glass layer and cannot be completely pulverized by easy pulverization and becomes a powder containing large lumped particles (aggregated lump). Such a powder needs strong pulverization according to the purpose of use.

Thus, it could therefore be advantageous to provide sialon phosphor particles or a powder exhibiting high emission intensity in the region from ultraviolet to blue, and not requiring a strong pulverization for pulverizing a sintered body or a large aggregated lump, and a production method thereof.

SUMMARY

We found that when a sialon is produced using a raw material composition containing a large amount of oxygen and then the glass layer produced on the sialon surface is removed, a sialon phosphor powder assured of high emission intensity and free of a large aggregated lump can be obtained. That is, we provide sialon phosphor particles represented by the formula:

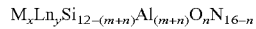

$$M_xLn_ySi_{12-(m+n)}Al_{(m+n)}O_nN_{16-n}$$

(wherein M is at least one metal selected from the group consisting of Li, Ca, Mg and Y, Ln is a lanthanide metal containing at least Eu, and assuming that the valence of the metal M is a and the valence of the lanthanide metal Ln is b, ax+by=m, x is 0<x, y≦2.0, 0.3≦m<4.5 and 0.5≦n<2.5), wherein in the surface analysis by X-ray photoelectron spectroscopy, the ratio between the peak area of $3d_{5/2}$ spectrum of europium and the peak area of 2p spectrum of Si is 0.5 or less.

We also provide a sialon phosphor powder comprising the above-described sialon phosphor particles, wherein the phosphor particles are aggregate particles and the average particle diameter obtained by a laser diffraction/scattering particle size distribution measuring method is from 5 to 100 microns.

We further provide a method for producing the above-described sialon phosphor particles, comprising mixing (a) silicon nitride, (b) a substance which becomes an aluminum source and contains AlN, (c) an oxide of the metal M (wherein M is at least one metal selected from the group consisting of Li, Ca, Mg and Y) or a precursor substance which becomes the oxide upon thermal decomposition, and (d) an oxide of the lanthanide metal Ln containing at least Eu, or a precursor substance which becomes the oxide upon thermal decomposition; firing the resulting mixed particles at 1,400 to 2,000° C. in a nitrogen-containing inert gas atmosphere; and acid-treating the obtained sialon particle.

The production method of sialon phosphor particles is characterized in that the acid treatment is a treatment for charging the sialon particles obtained by the firing into an acid solution selected from a sulfuric acid, a hydrochloric acid an a nitric acid, thereby removing the glass layer on the surface.

We also provide a light-emitting device comprising a blue light-emitting element capable of emitting blue light having a peak wavelength of 430 to 475 nm, and a phosphor layer containing the above-described sialon phosphor particles and capable of absorbing a part of the blue light and converting it into yellow light having a peak wavelength of 520 to 600 nm, wherein white light can be emitted by mixing the blue light and yellow light.

We still further provide a light-emitting device comprising a violet light-emitting element capable of emitting violet light having a peak wavelength of 390 to 430 nm, and a phosphor layer containing the sialon phosphor particles claimed in claim 1 and capable of absorbing a part of the violet light and converting it into yellow light having a peak wavelength of 520 to 600 nm, wherein white light can be emitted by mixing the violet light and yellow light.

The glass layer formed on the surface of sialon phosphor particles is removed, whereby strong fluorescence can be emitted in the wavelength range from ultraviolet to blue without allowing absorption of light by the glass layer, and furthermore, a phosphor powder free from large fused particles due to the glass layer can be obtained. Such a sialon phosphor can be used as a fluorescent material or a phosphor powder. This phosphor is particularly suitable as a fluorescent material or phosphor powder for white light-emitting diodes.

DETAILED DESCRIPTION

We describe selected aspects of our particles, production methods and light-emitting devices in detail below. The sialon phosphor particles are particles comprising a fluorescent material represented by formula (1):

$$M_x Ln_y Si_{12-(m+n)} Al_{(m+n)} O_n N_{16-n} \quad (1)$$

(wherein M is at least one metal selected from the group consisting of Li, Ca, Mg and Y, Ln is a lanthanide metal containing at least Eu, and assuming that the valence of the metal M is a and the valence of the lanthanide metal Ln is b, ax+by=m, x is 0<x, y≦2.0, 0.3≦m<4.5 and 0.5≦n<2.5).

Figure 1A:
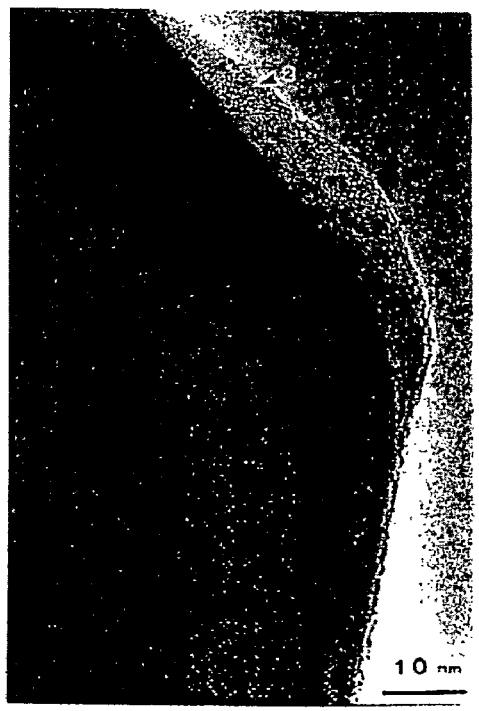
FIGS. 1A and 1B are electron micrographs showing the surface state of a sialon particle before and after acid treatment, respectively.

The lanthanide metal may be only Eu, or the Eu may contain other lanthanide metals. Examples of a lanthanide metal, which may be contained include Dy, Er, Th, Yb and Ce. In formula (1), if m and n are out of the above ranges, a crystal phase other than α-sialon is formed, which is not preferred. We found that, to produce a sialon phosphor having a high emission intensity by the above-described composition, the sialon is preferably synthesized from raw materials giving a composition where n is 1.0 or more. However, if n exceeds 1.25, the emission intensity was confirmed to decrease. This phenomenon was studied, and as a result, it was revealed that a glass layer is formed on the sialon surface. The photograph in which an electron microscope (TEM) was used of FIG. 1A shows the existence of the glass layer. The portion adhering to the surface was analyzed and found to be composed of an oxide mainly comprising europium (Eu) and calcium (Ca). Also, this adhering portion was determined to be a glass (amorphous) phase because the portion does not appear in the identification of phases by X-ray and no definite regularity is seen in the TEM photograph.

Figure 3:
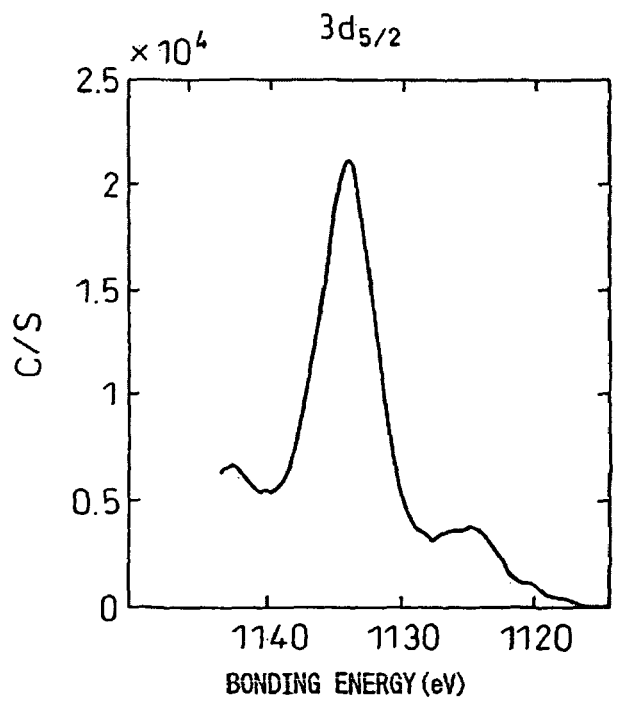
FIG. 3 is a view showing the $Eu3d_{5/2}$ spectrum on the surface of a sialon.

Then, we observed the $3d_{5/2}$ spectrum of Eu in this portion by X-ray photoelectron spectroscopy (XPS) using Kα of Al for the X-ray source of XPS. FIG. 3 shows a measurement example. Furthermore, the 4d spectrum of the same sample and the spectrum of $Eu_2O_3$ prepared separately were also measured in the same manner. The spectra obtained was identified by the Handbook of X-ray photoelectron spectroscopy, Physical Electronic, Inc. and, as a result, it was found that in FIG. 3, the peak at 1,135 eV is the peak assigned to $Eu^{3+}$ and the peak at 1,125 eV is the peak assigned to $Eu^{2+}$. From the results obtained, the Eu was confirmed to be mostly a trivalent. Since a divalent Eu participates in the fluorescence of this sialon, the trivalent Eu is considered to not participate in light emission, but assists in the absorption of excitation light.

To remove this glass layer, we attempted removal of the surface glass layer with an acid. However, other methods may also be considered for the removal of the surface glass layer. The excitation spectra before and after the removal of the glass layer was compared and it was confirmed that when the glass layer is present, fluorescence is low in the region of 250 to 460 nm, whereas after the removal of the glass layer, the fluorescence intensity is improved (see, for example, FIG. 2). The main utilization form of the sialon phosphor particle or powder is a fluorescent material for white light-emitting diodes. In this case, the yellow fluorescence intensity excited by the light from violet (for example, light at a wavelength of 400 nm) to blue (for example, light at a wavelength of 460 nm) is important. The fluorescence intensity is greatly improved in this wavelength range, particularly in the violet light region, by virtue of performing the removal of glass, and therefore we provide an important technique to the sialon phosphor for white light-emitting diodes.

Figure 1B:

FIG. 1B shows a TEM photograph of the sialon phosphor surface after acid cleaning. Disappearance of the glass layer can be seen. The $3d_{5/2}$ spectrum of Eu on the sialon surface at this time was analyzed by XPS. In the measurement by XPS, the shifting of values during analysis in each measurement is a problem, and therefore, the comparison was performed through normalization by dividing the $3d_{5/2}$ peak area of Eu by the peak area of Si2p spectrum in the same measurement. As a result, for example, as shown in Table 1, it was confirmed that both the trivalent and divalent of Eu was greatly decreased. The cause thereof is a decrease of the Eu-containing glass layer on the surface.

That is, in the surface analysis by X-ray photoelectron spectroscopy of the sialon phosphor particles, the ratio between the peak area of $3d_{5/2}$ spectrum of europium and the peak area of 2p spectrum of Si is 0.5 or less. When the ratio between the peak area of $3d_{5/2}$ spectrum of europium and the peak area of 2p spectrum of Si is made to be 0.5 or less, absorption of light in the region from 250 to 460 nm is decreased, and in turn fluorescence intensity can be greatly improved.

The ratio between the peak area of $3d_{5/2}$ spectrum of trivalent europium on the surface and the peak area of 2p spectrum of Si is preferably 0.4 or less. When the ratio between the peak area of $3d_{5/2}$ spectrum of trivalent europium and the peak area of 2p spectrum of Si is made to be 0.4 or less, absorption of light particularly from 250 to 400 nm due to trivalent europium is reduced and fluorescence intensity can be greatly improved. The ratio between the peak area of $3d_{5/2}$ spectrum of europium and the peak area of 2p spectrum of Si is more preferably 0.3 or less.

The removal of the Eu-containing glass layer was found to also have an effect of improving the particle size of the sialon phosphor powder. In the case of using a raw material containing a large amount of oxygen, sialon particles aggregate through a glass layer to produce a large lump, but when the glass layer is removed, the aggregated lump is deflocculated. More specifically, when the particle diameters in terms of 90% under sieve (d90) diameter before and after the removal of glass layer were compared, an improvement to 80 μm from 350 μm was confirmed. By reduction in the size of large particles, pulverization can be dispensed with or sialon having the objective particle size can be obtained by relatively mild pulverization.

Furthermore, we studied the relationship between particle size and emission intensity in sialon phosphor particles reduced in the glass layer, and found that when the average particle diameter is from 5 to 100 microns, a phosphor with good emission properties is obtained. Incidentally, the particle diameter was measured by a laser diffraction/scattering particle size distribution measuring method.

That is, the sialon phosphor powder is a sialon phosphor powder comprising sialon phosphor particles, and it is preferred that the phosphor particles are aggregate particles and the average particle diameter obtained by a laser diffraction/scattering particle size distribution measuring method is from 5 to 100 microns. When the average particle diameter is from 5 to 100 microns, light absorption by a large particle decreases and high fluorescence intensity results. The average particle diameter is more preferably from 10 to 60 microns.

The production method of the sialon phosphor particles is described below. The sialon phosphor particles are obtained by mixing (a) a silicon nitride powder, (b) a substance which becomes an aluminum source and contains AlN, (c) an oxide of the metal M (wherein M is at least one metal selected from the group consisting of Li, Ca, Mg and Y) or a precursor substance which becomes the oxide upon thermal decomposition, and (d) an oxide of the lanthanide metal Ln containing at least Eu, or a precursor substance, which becomes the oxide upon thermal decomposition; firing the resulting mixed particle at 1,400 to 2,000° C. in a nitrogen-containing inert gas atmosphere; and acid-treating the obtained sialon particles. The acid treatment is used for removing the glass layer on the sialon particle surface. The sialon particles obtained are α-sialon.

The silicon nitride as a raw material in the production of the sialon phosphor particle includes crystalline silicon nitride and amorphous silicon nitride and is preferably amorphous silicon nitride. By using amorphous silicon nitride as a raw material of the sialon phosphor particles, a higher effect of removing the glass layer is obtained. When crystalline silicon nitride is used, aggregation through a glass layer readily occurs and the glass layer tends to be insufficiently removed, giving rise to a lower effect of removing the glass layer than that in the sialon using amorphous silicon nitride. Also, strong aggregation is brought about and the pulverization needs to be violently performed as compared with the case using amorphous silicon nitride. When an amorphous silicon nitride powder is used, the sialon can be obtained in a powdered state, which is weakly aggregated and the glass layer can be easily removed.

The substance which becomes an aluminum source and contains AlN is any one of AlN powder alone, a combination of AlN powder and Al powder, and a combination of AlN powder and powder of Al oxide or a precursor substance becoming Al oxide upon thermal decomposition, and this substance becomes an Al source and/or a nitrogen or oxygen source of the sialon phosphor.

Examples of precursor substances which become an Al oxide, a metal M oxide and a lanthanide metal Ln oxide upon thermal decomposition include a nitride, hydroxide, carbonate and chloride of respective elements.

More specifically, examples of the Al oxide and the precursor substance which become an Al oxide upon thermal decomposition include $Al_2O_3$ and $Al(OH)_3$. Examples of the metal M oxide and precursor substance becoming an oxide upon thermal decomposition include, when M is Ca, $CaCO_3$, $Ca(OH)_2$ and $CaCl_2$. Examples of the lanthanide metal Ln oxide and the precursor substance becoming lanthanide metal Ln oxide upon thermal decomposition include, when Ln is Eu, $Eu_2O_3$, $EuCl_3$ and $Eu(NO_3)_3$. The Al oxide or the precursor becoming Al oxide upon thermal decomposition, the metal M oxide or the precursor substance becoming the metal M oxide upon thermal decomposition, and the lanthanide metal Ln oxide or the precursor substance becoming the oxide upon thermal decomposition, each is preferably used in a powdered state.

As for the oxygen amount of the sialon phosphor, in the above formula, n is preferably 1.0 or more. If n is less than 1.0, the emission intensity is decreased. This is considered to occur because the crystallization of sialon insufficiently occurs.

The amorphous silicon nitride powder can be obtained by thermally decomposing silicon diimide ($Si(NH)_2$) at about 700 to 1,100° C. in a nitrogen atmosphere.

The method for mixing respective starting materials is not particularly limited and a known method such as a method of dry-mixing for the starting materials or a method of wet-mixing for the starting materials in an inactive solvent substantially incapable of reacting with each component of the raw materials, and then removing the solvent, may be employed. As for the mixing apparatus, a V-shaped mixer, a rocking mixer, a ball mill, a vibration mill, a medium stirring mill or the like can be suitably used. However, the amorphous silicon nitride powder is very sensitive to water or moisture, and therefore the mixing of starting materials must be performed in a controlled inert gas atmosphere.

The mixture of starting materials is fired at 1,400 to 1,800° C., preferably from 1,500 to 1,800° C., in a nitrogen gas atmosphere under 1 atm, whereby the objective sialon phosphor powder is obtained. If the firing temperature is less than 1,400° C., heating for a long period of time is necessary for the production of the desired sialon powder and is not practical. Also, the production ratio of the α-sialon phase in the produced powder decreases. On the other hand, if the firing temperature exceeds 1,800° C., this disadvantageously causes sublimation and decomposition of silicon nitride and, results in sialon producing free silicon.

The powder mixture of starting materials can also be fired at a temperature of 1,600 to 2,000° C., however preferably from 1,600 to 1,900° C., in a pressurized nitrogen gas atmosphere. In this case, the pressurized nitrogen gas prevents the silicon nitride and sialon from sublimating and decomposing at a high temperature and the desired α-sialon-based phosphor can be obtained in a short amount of time. The firing temperature can be elevated by increasing the nitrogen gas pressure, and the powder mixture can be fired, for example, at 1,600 to 1,850° C. under a nitrogen gas pressure of 5 atm and at 1,600 to 2,000° C. under a nitrogen gas pressure of 10 atm.

The heating furnace used for the firing of a powder mixture is not particularly limited, and for example, a batch electric furnace using a high frequency induction heating system or resistance heating system, a rotary kiln, a fluidized firing furnace or a pusher type electric furnace can be used.

The acid treatment is a treatment for charging the sialon particle into an acid solution selected from a sulfuric acid, a hydrochloric acid and a nitric acid, thereby removing the glass layer from the surface. Examples of the acid solution which can be used for removing the glass layer on the surface include a sulfuric acid, a hydrochloric acid and a nitric acid. The concentration is from 0.1 to 7 normal, however preferably from 1 to 3 normal. If the concentration is excessively high, oxidation occurs and a good fluorescent property cannot be obtained. In the acid solution with an adjusted concentration, the sialon powder is charged in an amount of 5 wt % based on the solution and kept for a desired time while stirring. After washing, the solution containing sialon is filtered, and the obtained sialon is washed with water to remove the acid and then dried.

The europium-activated sialon phosphor particle is kneaded with a transparent resin, such as epoxy resin, silicone resin or acrylic resin by a known method to produce a coating agent, and the light-emitting diode of which surface is coated with this coating agent is used as a white light-emitting diode.

The light-emitting device which can emit white light comprises a blue light-emitting element capable of emitting blue light having a peak at a wavelength from 430 to 475 nm, and a phosphor layer containing the above-described sialon phosphor particle and capable of absorbing a part of the blue light and converting it into yellow light having a peak at a wavelength from 520 to 600 nm, wherein white light can be emitted by mixing of the blue light and the yellow light.

Furthermore, the light-emitting device which can emit white light comprises a violet light-emitting element capable of emitting violet light having a peak at a wavelength from 390 to 430 nm, and a phosphor layer containing the sialon phosphor particle claimed in claim 1, and capable of absorbing a part of the violet light and converting it into yellow light having a peak at a wavelength from 520 to 600 nm, wherein white light can be emitted by the mixing of the violet light and the yellow light.

As for the blue-light emitting element, an InGaN-based light-emitting diode element can be used. The phosphor layer containing the sialon phosphor particles is formed by kneading the sialon phosphor particles with a transparent resin, such as epoxy resin and coating the resulting paste on the light-emitting element. That is, the light-emitting device has a construction that a phosphor layer is formed on a light-emitting element and a part of light emitted from the light-emitting element is absorbed by the phosphor layer and after wavelength conversion, comes out from the phosphor layer, while a part of light emitted from the light-emitting element passes directly through and comes out from the phosphor layer. These lights are mixed and observed as apparent white light.

Figure 9:
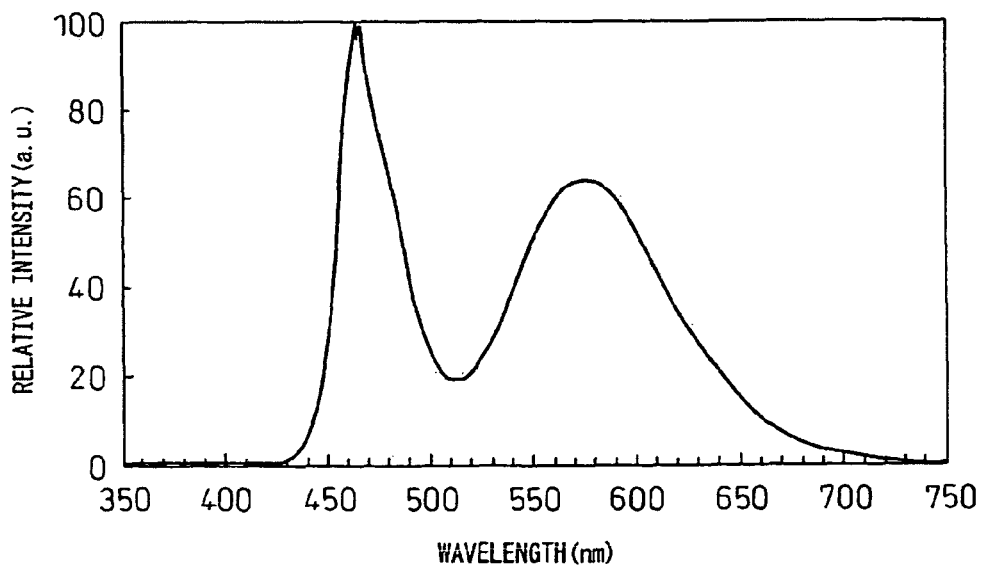
FIG. 9 is a view showing the emission spectrum of the light-emitting device in Example 6.

FIG. 9 shows the emission spectrum of a light-emitting device produced by fixing a blue light-emitting element on the package for a light-emitting diode, electrically connecting the element, and coating the above-described coating layer. White light is obtained by virtue of blue light which is about 460 nm emitted from the light-emitting element and has a fluorescence of about 570 nm emitted from the sialon phosphor after absorbing the blue light.

Figure 10:
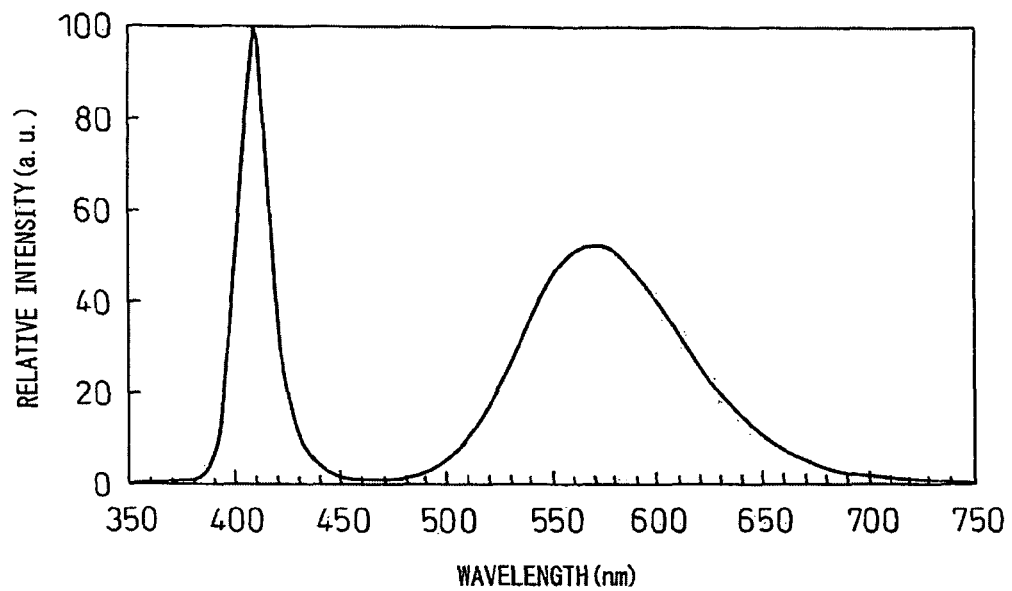
FIG. 10 is a view showing the emission spectrum of the light-emitting device in Example 7.

Similarly, an InGaN-based light-emitting diode element may also be used as a violet light-emitting element. FIG. 10 shows the emission spectrum of a light-emitting device produced in the same manner as above by using a violet light-emitting element. White light is obtained by virtue of violet light which is about 410 nm emitted from the light-emitting element and has a fluorescence of about 570 nm emitted from the sialon phosphor after absorbing the violet light.

Figure 11:
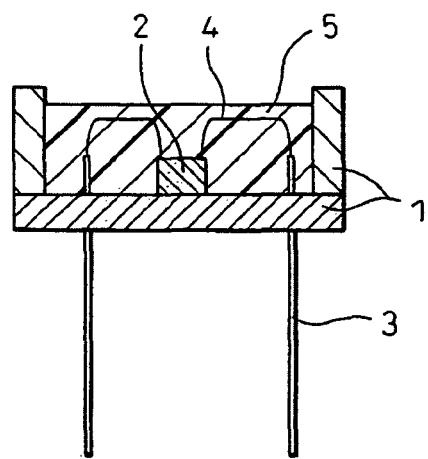
FIG. 11 is a view showing one aspect of a light-emitting device.

The light-emitting device is described below. FIG. 11 is a view showing one embodiment of the light-emitting device. In FIG. 11, the light-emitting device comprises a light-emitting element capable of emitting light to the excitation source and a phosphor layer provided to receive the light. Examples of the light-emitting element include a light-emitting diode element and a laser oscillator element. Here, when a light-emitting diode element is used as the light-emitting element, the light-emitting device is called a light-emitting diode. In the light-emitting device of FIG. 11, a light-emitting element 2 is fixed on a supporting stand 1 made of metal. The electrode on the light-emitting element is connected to an electrode 3 of the supporting stand through an electrically conducting wire 4. On the light-emitting element 2, a phosphor layer 5 containing the phosphor in a resin is formed. The first light (for example, blue light) outgoing from the light-emitting element 2 is partially converted into a second light (for example, white) by the phosphor layer 5 and partially transmitted as it is, and these lights are mixed and come out.

As for the light-emitting diode element, a commercially available light-emitting diode element can be used.

The electrically conducting wire preferably has a size of 10 to 45 μm in view of working with a wire bonder, and examples of the construction material therefor include gold, copper, aluminum, platinum and an alloy thereof. Examples of the electrode of the supporting stand include iron, copper, gold, iron-containing copper, tin-containing copper, or silver-plated aluminum, iron or copper.

The embodiment of the phosphor layer includes a layer comprising a light-transparent resin having dispersed therein the phosphor powder. The phosphor layer can be formed, for example, by dispersing the phosphor powder in a silicone resin and coating the phosphor-containing resin.

EXAMPLES

Comparative Example 1

Figure 2:
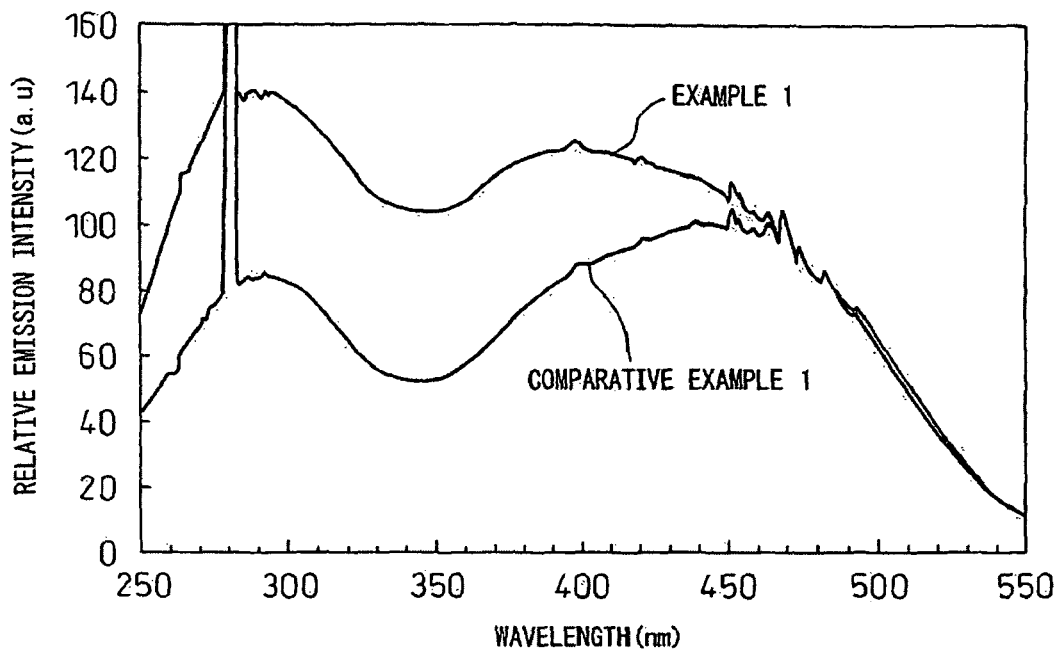
FIG. 2 is a view showing the excitation spectra before and after the removal of the glass layer of the sialon phosphor particle.

An amorphous silicon nitride powder obtained by reacting silicon tetrachloride and ammonia and decomposing the resulting silicon diimide under heating, an aluminum nitride powder, an aluminum oxide powder, a calcium carbonate powder and a europium oxide powder were weighed to give a composition of $Ca_{0.6}Eu_{0.1}Si_9Al_3O_{1.5}N_{14.5}$ (m=1.5, n=1.5). The weighed powders were mixed by a vibration mill for 1 hour in a nitrogen atmosphere. The resulting mixed powder was filled in a carbon crucible, the crucible was placed in a high-frequency heating furnace, and the furnace was heated by a temperature-rising schedule of holding the furnace, from room temperature to 1,200° C. for 1 hour, from 1,200 to 1,400° C. for 4 hours and from 1,400 to 1,700° C. for 3 hours, whereby a sialon powder was obtained. The obtained sialon powder was a weakly sintered lump, and therefore was lightly ground using an agate mortar until a powder free from a large lump. The surface of the sialon particle after grinding was observed by TEM. FIG. 1A shows the results. As seen from FIG. 1A, an attached matter shown by the arrow portion in the Figure was observed. This matter was analyzed and found to be a glass layer containing Eu and Ca. The excitation spectrum of the sialon particle having formed thereon the glass layer was measured using FP777 manufactured by JASCO Corp. The fluorescent wavelength was set to 560 um. This fluorescent wavelength is a nearly fluorescent peak position of the sialon phosphor determined by the same apparatus. FIG. 2 shows the results. Also, the surface of this sample was analyzed by XPS. Incidentally, Kα of Al was used for the X-ray source of XPS (X-ray photoelectron spectroscopy). FIG. 3 shows an example of the spectrum. Furthermore, the Si2p spectrum was measured, the peak area of Si2P spectrum and the peak area of $Eu3d_{5/2}$ spectrum were determined, and the ratio therebetween was determined. The result is shown in Table 1. Also, the peak of $Eu3d_{5/2}$ was separated into a trivalent and a divalent of Eu, and the ratios of the peak area of Si2p to the peak area of $Eu^{3+}$ and to the peak area of $Eu^{2+}$ were determined. The results obtained are also shown in Table 1. From comparison between the $Eu^{3+}$ peak and the $Eu^{2+}$ peak, it can be seen that a large amount of $Eu^{3+}$ is present on the surface. When the particle size distribution of the powder was analyzed by a laser diffraction/scattering particle size distribution measuring apparatus, the particle diameter was found to be 183 μm in terms of d90.

Example 1

Subsequently, this powder was stirred in a 2N-nitric acid solution for 1 hour and the fluorescent properties of the obtained sialon were determined. FIG. 2 shows the results, revealing that the light emission in the region from 250 to 460 nm was greatly improved. The ratio between the peak area of $3d_{5/2}$ spectrum of europium and the peak area of 2p spectrum of Si by XPS is shown in Table 1. A great decrease of the total Eu, particularly, a decrease of $Eu^{3+}$ was confirmed. From these results, the improvement of fluorescent properties is considered to be a result of the removal of the glass layer mainly containing trivalent Eu on the surface. Furthermore, the sialon particle surface after acid treatment was observed by TEM. FIG. 1B shows the results. It is seen that although a thick glass layer comprising oxides of Ca and Eu was observed before the acid treatment of FIG. 1A, the thick glass layer on the surface was removed after the acid treatment. When the particle size distribution of the powder was examined, the particle diameter was found to be 29 μm in terms of d90. It is seen that large particles became small by the removal of glass.

TABLE 1

|  | Eu/Si | $Eu^{3+}$/Si | $Eu^{2+}$/Si |
|---|---|---|---|
| Comparative Example 1 | 2.68 | 2.49 | 0.19 |
| Example 1 | 0.40 | 0.30 | 0.10 |

Comparative Example 2

Figure 4:
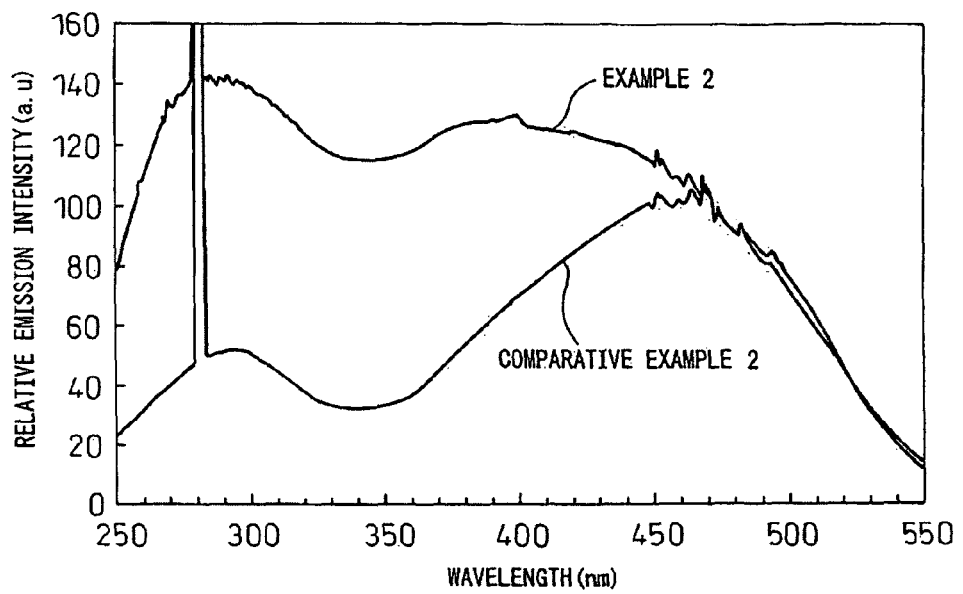
FIG. 4 is a view showing the excitation spectrum of the sialon phosphor particles obtained in Example 2.

A sialon phosphor was produced in the same manner as in Comparative Example 1, except for changing the sialon composition in Comparative Example 1 to $Ca_{0.775}Eu_{0.15}Si_8Al_4O_2N_{14}$ (m=2.0, n=2.0). FIG. 4 shows the excitation spectrum. The ratio between the peak area of $3d_{5/2}$ spectrum of Eu in the obtained sialon particle and the peak area of 2p spectrum of Si is shown in table 2. When the particle size distribution of the powder was examined, the particle diameter was found to be 373 μm in terms of d90.

Example 2

The sialon powder obtained in Comparative Example 2 was charged into a 2N-sulfuric acid solution and stirred for 5 hours to obtain a sialon. FIG. 4 shows the evaluation results of excitation spectrum, revealing that similar to Example 1, the light emission in the region from 250 to 460 nm was greatly improved as compared with Comparative Example 2. Furthermore, the ratio between the peak area of $3d_{5/2}$ spectrum of Eu on the surface of the obtained sialon phosphor particle and the peak area of 2p spectrum of Si is shown in Table 2. The total amount of Eu, trivalent Eu and divalent Eu were all decreased similar to Example 1, because the glass layer on the surface was removed. When the particle size distribution of the powder was examined, the particle diameter was found to be 87 μm in terms of d90. It is seen that large particles became small by the removal of glass.

TABLE 2

|  | Eu/Si | $Eu^{3+}$/Si | $Eu^{2+}$/Si |
|---|---|---|---|
| Comparative Example 2 | 2.32 | 1.88 | 0.45 |
| Example 2 | 0.09 | 0.07 | 0.02 |

Comparative Example 3

Figure 5:
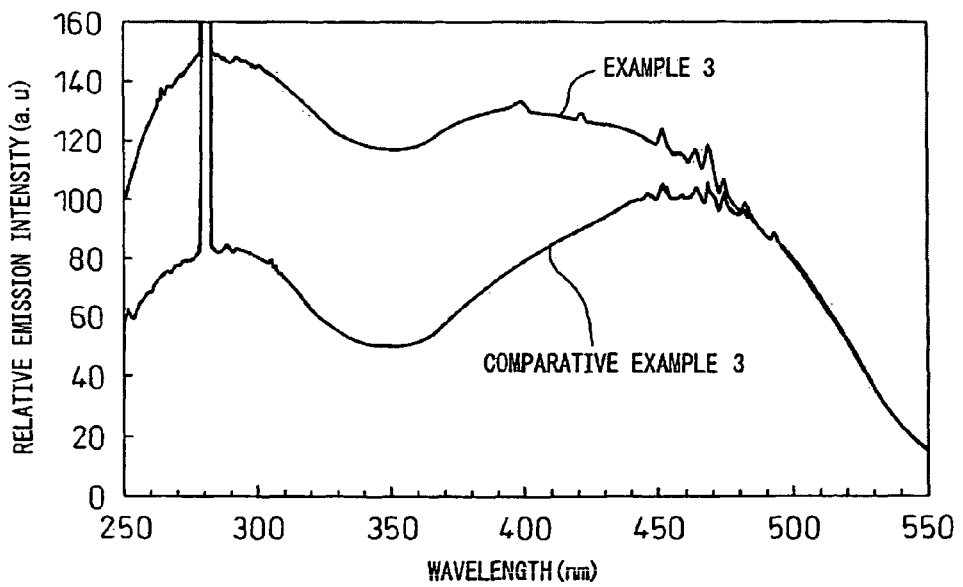
FIG. 5 is a view showing the excitation spectrum of the sialon phosphor particles obtained in Example 3.

A sialon particle was produced in the same manner as in Comparative Example 1, except for changing the sialon composition in Comparative Example 1 to $Ca_1Eu_{0.1667}Si_{8.25}Al_{3.75}O_{1.25}N_{14.75}$ (m=2.5, n=1.25), and the excitation spectrum was measured. FIG. 5 shows the results.

Example 3

The sialon powder obtained in Comparative Example 3 was further charged into a 2N-sulfuric acid solution and stirred for 1 hour, and the excitation spectrum of the obtained sialon phosphor particle was measured. FIG. 5 shows the results, revealing that the light emission in the region from 250 to 460 nm was greatly improved by the removal of glass.

Example 4

Figure 6:
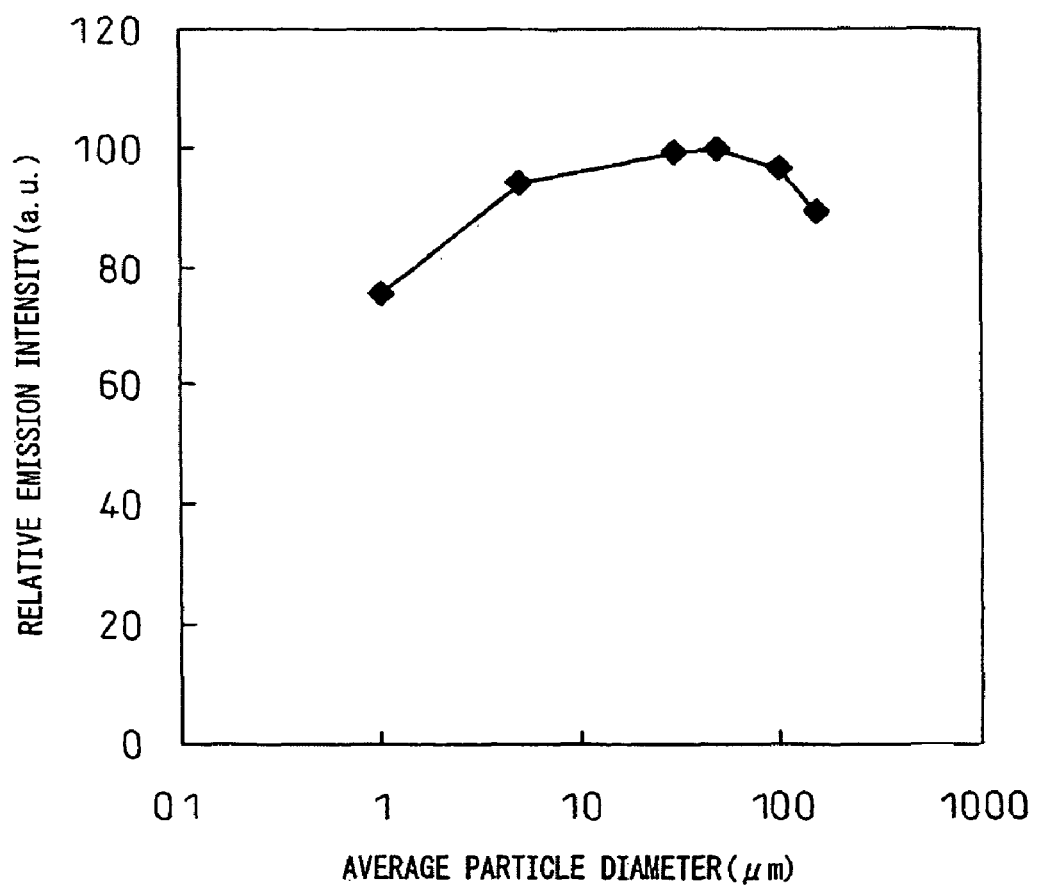
FIG. 6 is a view showing the relationships between the average particle diameter and the relative emission intensity obtained in Example 4.
Figures 7A, 7B:
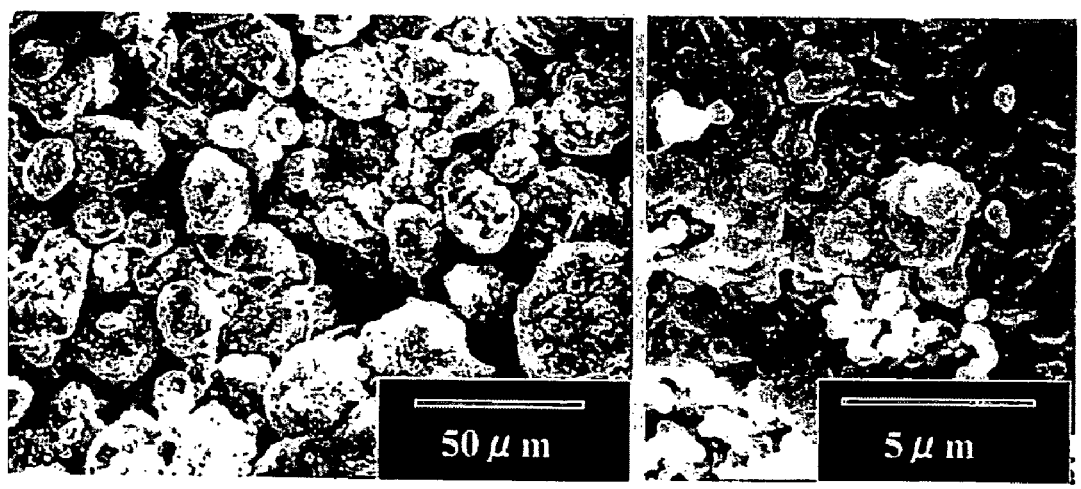
FIGS. 7A and 7B are scanning electron micrographs of the sialon phosphor particles obtained in Example 4.

The sialon of Example 2 was classified to produce sialon phosphor powders having various particle sizes. The excitation spectra of these sialon phosphor powders were measured, and the relationship between the emission intensity at 400 nm and the average particle diameter was determined. FIG. 6 shows the results. When the average particle diameter was 5 μm or less, the emission intensity was decreased, and when the average particle diameter became 10 μm or less, the emission intensity was improved and kept constant thereafter, but when the average particle diameter became as large as about 150 μm, the emission intensity was slightly decreased. From these, a sialon phosphor with high emission intensity was obtained in which the average particle diameter ranges from 5 to 100 μm. FIGS. 7A and 7B show the scanning electron micrographs of sialon phosphor particles having an average particle diameter of 30 μm. FIG. 7A is a photograph showing the particles, and FIG. 7B is a enlarged photograph showing the primary particles. It was confirmed that primary particles of about 1 μm are aggregated to form particles as uniform large lumps.

Comparative Example 4

Figure 8:
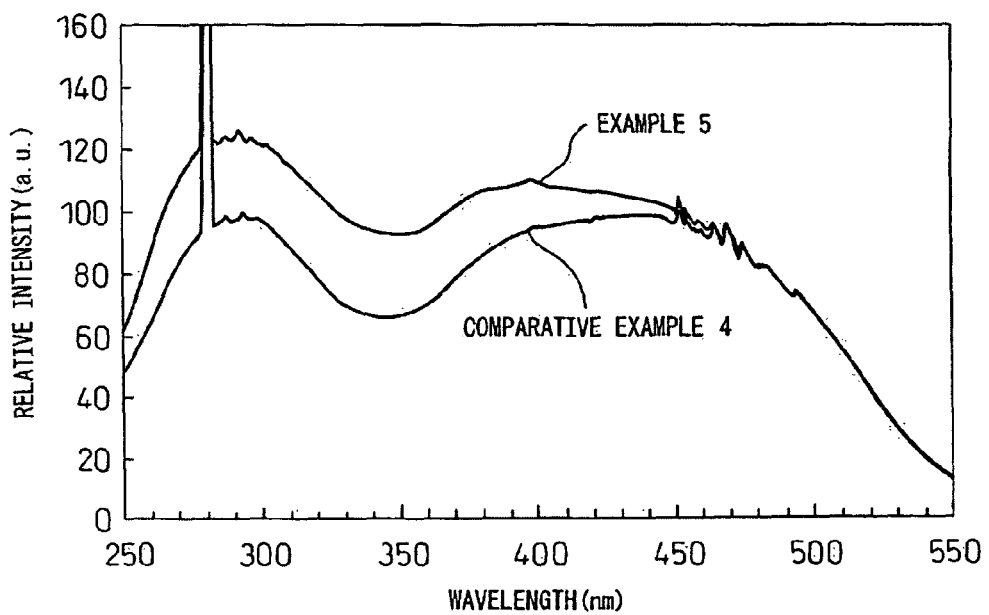
FIG. 8 is a view showing the excitation spectrum of the sialon phosphor particles obtained in Example 5.

A sialon was produced in the same manner as in Comparative Example 1, except for changing the raw material to crystalline silicon nitride. FIG. 8 shows the excitation spectrum of the obtained sialon particles.

Example 5

The sialon powder obtained in Comparative Example 4 was further charged into a 2N-nitric acid solution and stirred for 5 hours, and the excitation spectrum was measured. FIG. 8 shows the results, revealing that the light emission in the region from 250 to 460 nm was greatly improved by the removal of glass.

Example 6

An InGaN-based light-emitting diode element capable of emitting blue light was fixed on the package for a light-emitting diode and electrically connected. Subsequently, the sialon (20 parts by weight) of Example 1 was mixed with epoxy resin (100 parts by weight) to produce a paste. The paste was charged into the package and cured under heating to produce a light-emitting device. FIG. 11 is a schematic view showing the light-emitting device. FIG. 9 shows the emission spectrum of this light-emitting device.

Example 7

A light-emitting device was produced in the same manner as in Example 6, except for changing the light-emitting element to a violet light-emitting element. FIG. 10 shows the emission spectrum.

Industrial Applicability

According to our production methods, a sialon phosphor assured of high emission intensity in the region from ultraviolet to blue can be obtained. This sialon phosphor also does not contain large particles, and therefore is excellent also as a phosphor powder. Such a powder can be readily mixed with a resin or the like, and coated on a violet or blue LED chip, and a highly bright white LED can be easily obtained.

The invention claimed is:

1. Sialon phosphor particles represented by the formula:

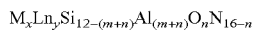

$$M_xLn_ySi_{12-(m+n)}Al_{(m+n)}O_nN_{16-n}$$

(wherein M is at least one metal selected from the group consisting of Li, Ca, Mg and Y, Ln is a lanthanide metal containing at least Eu, and assuming that the valence of the metal M is a and the valence of the lanthanide metal Ln is b, m=ax+by, x is 0<x, y≦2.0, 0.3≦m<4.5, 1.0≦n<2.5 and 1.0≦m/n≦2.0), wherein, in a surface analysis by X-ray photoelectron spectroscopy, a ratio between a peak area of $3d_{5/2}$ spectrum of Eu and a peak area of 2p spectrum of Si, obtained by acid-treating said sialon phosphor particles in which said ratio exceeds 0.5, is 0.5 or less.

2. A sialon phosphor powder comprising the sialon phosphor particles claimed in claim 1, wherein said phosphor particles are aggregate particles and average particle diameter obtained by a laser diffraction/scattering particle size distribution measuring method is from 5 to 100 microns.

3. The sialon phosphor particles as claimed in claim 1, wherein 1.25≦n<2.5.

4. The sialon phosphor particles as claimed in claim 2, wherein 1.25≦n<2.5.

5. The sialon phosphor particles as claimed in claim 1, wherein the ratio between the peak area of $3d_{5/2}$ spectrum of Eu and the peak area of 2p spectrum of Si, obtained by acid-treating the sialon phosphor particles in which said ratio is from 2.32 to 2.68, is 0.5 or less.

6. The sialon phosphor particles as claimed in claim 2, wherein the ratio between the peak area of $3d_{5/2}$ spectrum of Eu and the peak area of 2p spectrum of Si, obtained by acid-treating the sialon phosphor particles in which said ratio is from 2.32 to 2.68, is 0.5 or less.

7. The sialon phosphor particles as claimed in claim 3, wherein the ratio between the peak area of $3d_{5/2}$ spectrum of Eu and the peak area of 2p spectrum of Si, obtained by acid-treating the sialon phosphor particles in which said ratio is from 2.32 to 2.68, is 0.5 or less.

8. The sialon phosphor particles as claimed in claim 4, wherein the ratio between the peak area of $3d_{5/2}$ spectrum of Eu and the peak area of 2p spectrum of Si, obtained by acid-treating the sialon phosphor particles in which said ratio is from 2.32 to 2.68, is 0.5 or less.

9. The sialon phosphor particles as claimed in claim 1, wherein the ratio between the peak area of $3d_{5/2}$ spectrum of Eu and the peak area of 2p spectrum of Si is 0.4 or less.

10. The sialon phosphor particles as claimed in claim 2, wherein the ratio between the peak area of $3d_{5/2}$ spectrum of Eu and the peak area of 2p spectrum of Si is 0.4 or less.

11. The sialon phosphor particles as claimed in claim 3, wherein the ratio between the peak area of $3d_{5/2}$ spectrum of Eu and the peak area of 2p spectrum of Si is 0.4 or less.

12. The sialon phosphor particles as claimed in claim 4, wherein the ratio between the peak area of $3d_{5/2}$ spectrum of Eu and the peak area of 2p spectrum of Si is 0.4 or less.

13. A method for producing the sialon phosphor particles claimed in claim 1, comprising:
   mixing (a) silicon nitride, (b) a substance which becomes an aluminum source and contains AlN, (c) an oxide of the metal M (wherein M is at least one metal selected from the group consisting of Li, Ca, Mg and Y) or a precursor substance which becomes an oxide upon thermal decomposition, and (d) an oxide of lanthanide metal Ln containing at least Eu, or a precursor substance which becomes an oxide upon thermal decomposition,
   firing resulting mixed particles at 1,400 to 2,000° C. in a nitrogen-containing inert gas atmosphere, and
   acid-treating obtained sialon particles with an acid solution selected from sulfuric acid, hydrochloric acid and nitric acid and having a concentration of 0.1 to 7 normal, thereby removing the glass layer on the surface.

14. The method as claimed in claim 13, wherein concentration of the acid solution is from 1 to 3 normal.

15. The method as claimed in claim 13, wherein the mixed powder is fired at 1,400 to 1,800° C. in a nitrogen gas atmosphere under 1 atm.

16. The method as claimed in claim 14, wherein the mixed powder is fired at 1,400 to 1,800° C. in a nitrogen gas atmosphere under 1 atm.

17. A light-emitting device comprising:
   a blue light-emitting element capable of emitting blue light having a peak at a wavelength of 430 to 475 nm, and
   a phosphor layer containing the sialon phosphor particles claimed in claim 1 and capable of absorbing a part of the blue light and converting it into yellow light having a wavelength of 520 to 600 nm,
   wherein white light can be emitted by the mixing of the blue light and the yellow light.

18. A light-emitting device comprising:
   a blue light-emitting element capable of emitting blue light having a peak at a wavelength of 430 to 475 nm, and
   a phosphor layer containing the sialon phosphor particles claimed in claim 2 and capable of absorbing a part of the blue light and converting it into yellow light having a wavelength of 520 to 600 nm,
   wherein white light can be emitted by the mixing of the blue light and the yellow light.

19. A light-emitting device comprising:

a blue light-emitting element capable of emitting blue light having a peak at a wavelength of 430 to 475 nm, and a phosphor layer containing the sialon phosphor particles claimed in claim 3 and capable of absorbing a part of the blue light and converting it into yellow light having a wavelength of 520 to 600 nm, wherein white light can be emitted by the mixing of the blue light and the yellow light.

20. A light-emitting device comprising:

a violet light-emitting element capable of emitting violet light having a peak at a wavelength of 390 to 430 nm, and a phosphor layer containing the sialon phosphor particles claimed in claim 1 and capable of absorbing a part of said violet light and converting it into yellow light having a wavelength of 520 to 600 nm, wherein white light can be emitted by mixing said violet light and said yellow light.

* * * * *